(12) United States Patent
Braune et al.

(10) Patent No.: US 8,368,101 B2
(45) Date of Patent: Feb. 5, 2013

(54) ARRANGEMENT FOR GENERATING MIXED LIGHT AND METHOD FOR PRODUCING SUCH AN ARRANGEMENT

(75) Inventors: Bert Braune, Wenzenbach (DE); Gertrud Kraeuter, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 368 days.

(21) Appl. No.: 12/523,487

(22) PCT Filed: Jan. 23, 2008

(86) PCT No.: PCT/DE2008/000125
§ 371 (c)(1),
(2), (4) Date: Aug. 31, 2009

(87) PCT Pub. No.: WO2008/089740
PCT Pub. Date: Jul. 31, 2008

(65) Prior Publication Data
US 2010/0019266 A1  Jan. 28, 2010

(30) Foreign Application Priority Data

Jan. 25, 2007  (DE) .................. 10 2007 003 808
Feb. 8, 2007  (DE) .................. 10 2007 006 349

(51) Int. Cl.
*H01L 33/00* (2010.01)
*H01L 21/00* (2006.01)
(52) U.S. Cl. .................. 257/98; 257/100; 257/E33.061; 438/27; 438/29
(58) Field of Classification Search ........... 257/E33.059, 257/E33.067, E33.071
See application file for complete search history.

(56) References Cited

U.S. PATENT DOCUMENTS

| | | | |
|---|---|---|---|
| 6,759,803 | B2 | 7/2004 | Sorg |
| 7,084,435 | B2 | 8/2006 | Sugimoto et al. |
| 7,446,472 | B2 | 11/2008 | Matsukaze |
| 2002/0057057 | A1 | 5/2002 | Sorg |
| 2004/0041222 | A1* | 3/2004 | Loh ................ 257/433 |
| 2004/0183081 | A1* | 9/2004 | Shishov et al. .......... 257/79 |
| 2004/0212302 | A1 | 10/2004 | Letz et al. |
| 2005/0093430 | A1 | 5/2005 | Ibbetson et al. |
| 2005/0221519 | A1* | 10/2005 | Leung et al. .......... 438/27 |
| 2005/0239227 | A1 | 10/2005 | Aanegola et al. |
| 2006/0012299 | A1* | 1/2006 | Suehiro et al. .......... 313/512 |
| 2006/0267041 | A1 | 11/2006 | Lin et al. |
| 2007/0012940 | A1 | 1/2007 | Suh et al. |
| 2008/0197368 | A1* | 8/2008 | Harle ................ 257/98 |
| 2009/0295265 | A1* | 12/2009 | Tabuchi et al. .......... 313/112 |

FOREIGN PATENT DOCUMENTS

| | | |
|---|---|---|
| CN | 1799148 A | 7/2006 |
| DE | 199 18 370 A1 | 11/2000 |
| DE | 103 11 820 A1 | 9/2004 |
| EP | 1 418 628 A1 | 5/2004 |
| JP | 57-128768 A | 8/1982 |

(Continued)

*Primary Examiner* — Benjamin Sandvik
*Assistant Examiner* — Leslie Pilar Cruz
(74) *Attorney, Agent, or Firm* — Slater & Matsil, L.L.P.

(57) ABSTRACT

An arrangement and a method for producing such an arrangement serve for generating mixed light. In this case, a semiconductor chip that emits an electromagnetic primary radiation has a luminescence conversion element in the beam path of the primary radiation. Furthermore, the arrangement includes a connecting element and a carrier element, wherein the carrier element carries and shapes the luminescence conversion element and the connecting element.

22 Claims, 3 Drawing Sheets

FOREIGN PATENT DOCUMENTS

| | | | |
|---|---|---|---|
| JP | 2001-92392 A | 4/2001 | |
| JP | 2004-22517 A | 1/2004 | |
| JP | 2004-47387 A | 2/2004 | |
| JP | 2004-349646 A | 12/2004 | |
| JP | 2004-349647 A | 12/2004 | |
| TW | 200644265 | 12/2006 | |
| WO | WO 2006034703 A1 | * | 4/2006 |
| WO | WO 2006067885 A1 | * | 6/2006 |

* cited by examiner

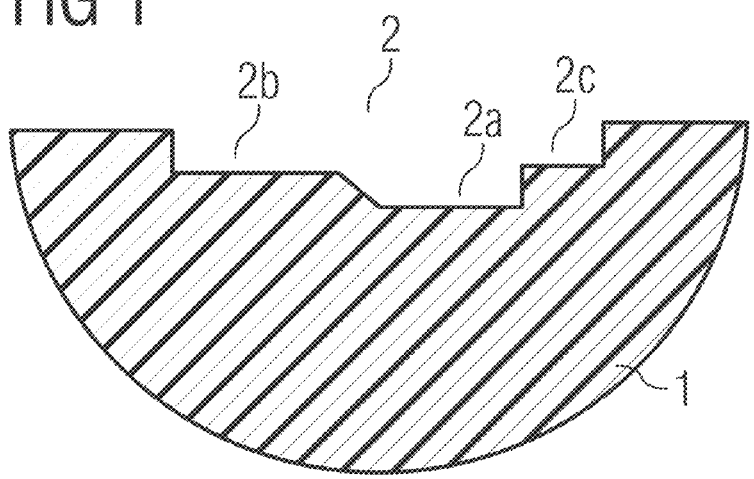
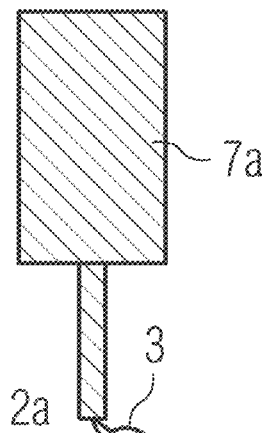
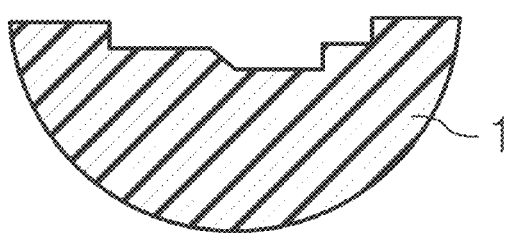

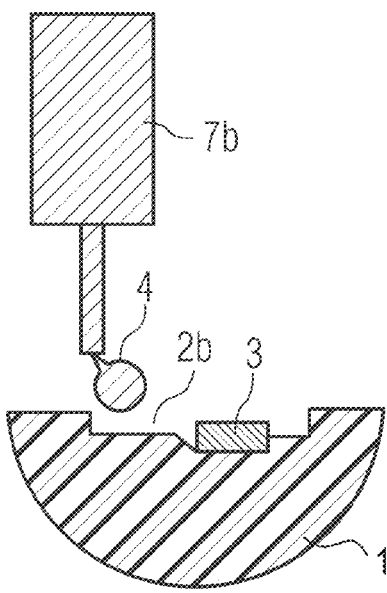
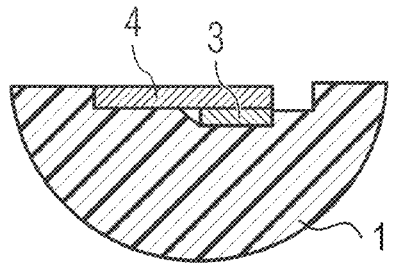
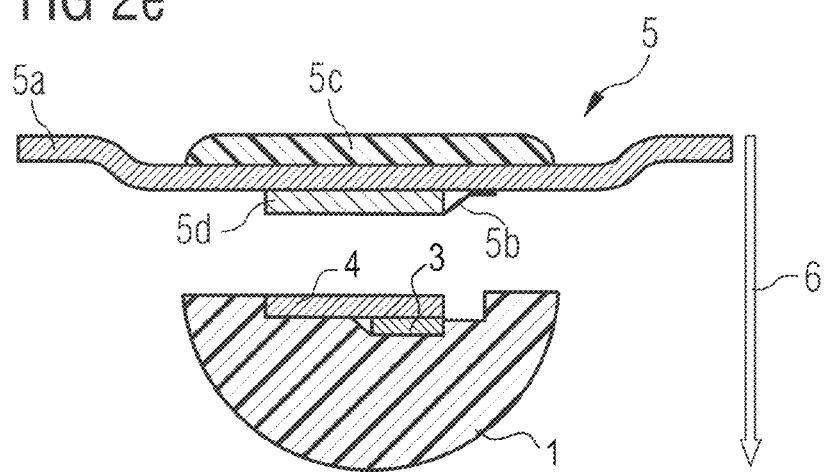
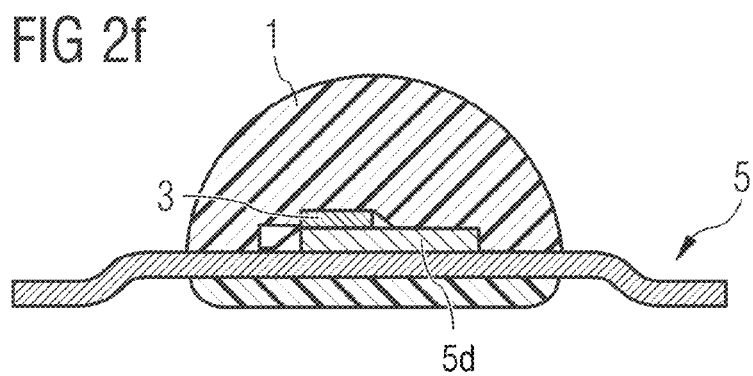

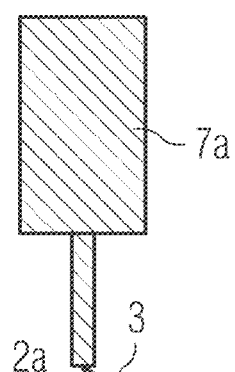
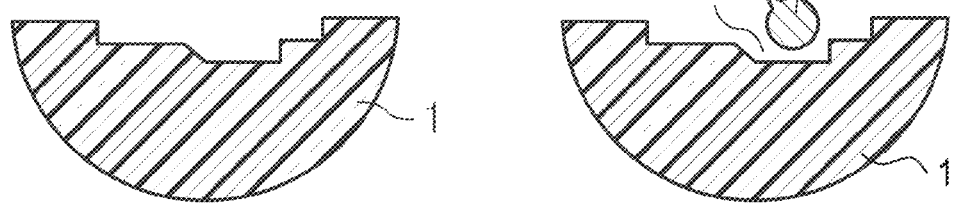
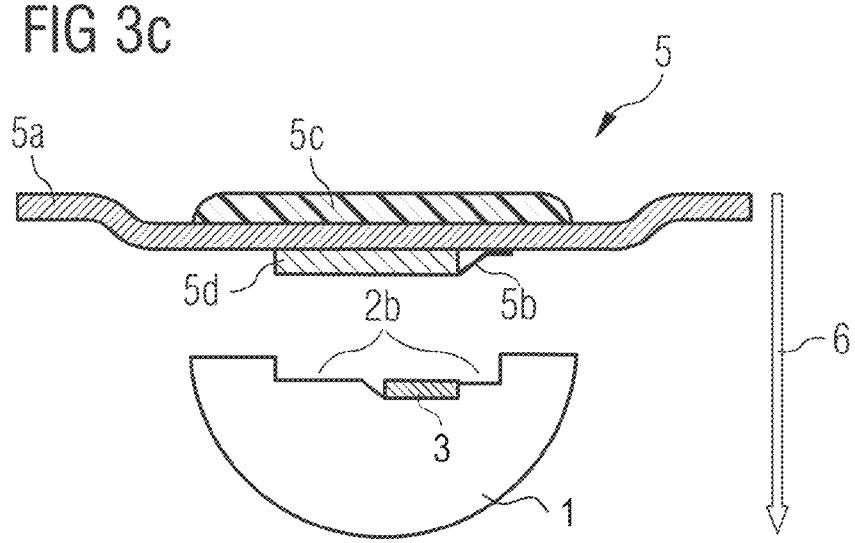
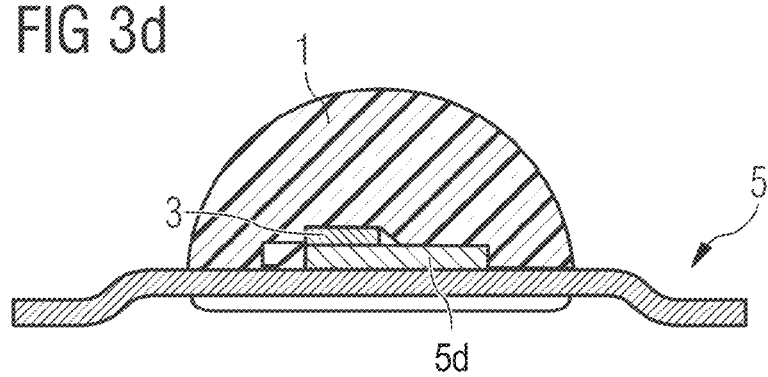

ARRANGEMENT FOR GENERATING MIXED LIGHT AND METHOD FOR PRODUCING SUCH AN ARRANGEMENT

This patent application is a 371 filing of PCT/DE2008/000125, filed Jan. 23, 2008, which claims the priority of German patent applications 10 2007 003 808.0, filed Jan. 25, 2007 and 10 2007 006 349.2, filed Feb. 8, 2007, both of which is hereby incorporated by reference in its entirety.

TECHNICAL FIELD

The invention relates to an arrangement and to a method for producing the arrangement which serves for generating a mixed light by means of at least one semiconductor component.

BACKGROUND

Mixed light sources are used in many fields nowadays. Thus, by way of example, mixed light sources can be found in fields of image reproduction or projection technology, but also in simple applications such as flashlights. Depending on their use, mixed light sources of different colors are generated in this case.

For use in flashlights, a mixed light source is preferably embodied as a white light source. In this case, the aim is to simultaneously generate and emit as many wavelengths as possible from the visible wavelength range, that is to say wavelengths of from 380 nm to 780 nm. For the operation of a mixed light source by means of energy stores, a very good energy balance is also advantageous in addition to a high color fidelity. This ensures, firstly, that illuminated objects reflect as authentically as possible and familiar subjective perception of the objects is thus obtained. Secondly, a high energy efficiency is advantageous in order to maintain temporally long operation of a mixed light source.

Mixed light sources are often generated by means of semiconductors nowadays and so-called primary colors are generated by simultaneous additive superposition. The primary colors are electromagnetic radiations in a narrow wavelength range, relative to the visible wavelength range, which are generated by an emissive semiconductor chip, for example, LED. By way of example, a generation of wavelengths in the range of 625 nm-740 nm represents the color red, of 520 nm-565 nm the color green, for 450 nm-500 nm the color blue. Other wavelength ranges are likewise conceivable. A simultaneous superposition of these colors in a wide variety of combinations generates mixed lights of different colors.

This superposition of the primary colors has hitherto been carried out by means of additive mixing. In image reproduction or projection technology, for example, subpixels, that is to say pixel subelements, of the colors red, green and blue are driven differently. The colors are superposed differently by means of the driving. Given sufficient distance between the viewer and the image reproduction device or the projection area and by virtue of a high number of such pixels, the impression of a multicolored image arises as a result of additive color mixing.

Furthermore, another possibility is also employed for generating mixed light sources. This usually involves using semiconductor components which emit electromagnetic radiation in a specific narrow wavelength range. This radiation is regularly referred to as primary radiation. In this case, this electromagnetic radiation need not necessarily be completely or partly in the visible wavelength range. This radiation is at least partly converted into a secondary wavelength by means of a luminescence conversion element.

In order to generate the primary radiation, active layers of a pn junction of a semiconductor chip situated in a semiconductor component are doped differently, for example. The resultant energy level differences in the energy level schemes, also referred to as band gaps, lead to an emission of light of different wavelengths. In this case, the wavelength of this emitted light is directly dependent on the energy level difference and adjustable to a limited extent by means of the doping.

The emitted primary wavelength of the semiconductor chip is at least partly converted into a secondary wavelength by means of a luminescence conversion element. For this purpose, it is important for the luminescence conversion element to be introduced into the beam path of the primary radiation of the semiconductor chip in such a way that the totality of the emitted photons of the primary radiation have to cover a path of optically identical length in the luminescence conversion element in order that all the photons to be converted convert to the new secondary wavelength in an identical way.

Semiconductor components which convert the primary wavelength into a secondary wavelength by means of a luminescence conversion element are produced by means of very cost-intensive and complex processes. The aim during production is primarily to introduce the luminescence conversion element into the beam path of the emissive semiconductor chip as far as possible in such a way that the mixed light generated has a wavelength spectrum that is constant over the entire emission range of the semiconductor component. In order to realize this constancy, screen printing and sedimentation processes are customary at the present time. Another method is the spatial separation of the luminescence conversion element from the emissive semiconductor chip.

In the case of production in a screen printing process it is necessary, for example, to ensure that the contact areas of the semiconductor chip are kept free. For this purpose it is necessary to decontaminate the bonding locations. A further problem is the small edge length of the emissive semiconductor chips. Furthermore, with a few micrometers, it is difficult nowadays to position a phosphor directly onto the semiconductor chip. This fabrication variant and the associated necessary cleaning of the fabrication apparatuses are very cost-intensive on account of the complexity.

For the production of a mixed light source by means of a sedimentation process, the phosphor is mixed with a resin and positioned onto the chip. The different viscosities of the two substances are then exploited. On the one hand, the two substances are separated from one another on account of the continuous time by virtue of which the phosphor material sediments from the low-viscosity resin, and a separation of the two substances is thereby accomplished. On the other hand, it is likewise possible to use a thermal process to control the viscosity at which the phosphor sediments starting from a specific threshold temperature.

Both methods make it possible to position a phosphor in such a way that a fluctuation of the wavelength spectrum of the emitted mixed light wavelength with respect to the emission characteristic of the entire semiconductor component is kept as small as possible. What is disadvantageous about these processes, however, is the high outlay for obtaining this constancy.

SUMMARY

In one aspect, the present invention generates a mixed light which can be produced even under simple process conditions and has a stable wavelength spectrum. Furthermore, the intention is to obtain a minimum fluctuation of the wavelength spectrum of the emitted mixed light over the emission location and a high energy efficiency.

In order to generate a mixed light, the invention specifies an arrangement comprising at least one semiconductor chip that emits an electromagnetic primary radiation. The semiconductor chip has in its beam path a luminescence conversion element, a connecting element and a carrier element. In this case, the carrier element is an element that shapes the luminescence conversion element, wherein the luminescence conversion element is introduced into the beam path by means of the carrier element. The carrier element, which introduces the luminescence conversion element into the beam path by virtue of its shaping, is advantageous in this case.

Furthermore, a method for producing an arrangement is specified, which generates a mixed light. In this case, an electromagnetic primary radiation generated by a semiconductor chip is at least partly converted into an electromagnetic secondary radiation by means of a luminescence conversion element. In this case, by means of the carrier element, the luminescence conversion element is positioned into the beam path of the primary radiation of the semiconductor chip and connected to the latter in such a way that a homogeneous distribution of the luminescence conversion element on the carrier element is achieved. A maximum transmission of the mixed light is achieved by an advantageous embodiment of the connecting elements and of the carrier elements in the form that these two elements are transparent to the mixed light wavelength to be emitted. As a result of the production of an arrangement in this way, the production process for such an arrangement is significantly simpler.

In order to generate a mixed light having specific wavelengths, an arrangement is described which is realized with the aid of semiconductor chips, wherein at least one semiconductor chip has a luminescence conversion element in the beam path and this semiconductor component emits a primary wavelength. This electromagnetic primary radiation is at least partly converted into an electromagnetic secondary radiation. The advantage of this arrangement is a generation of a mixed light with the aid of one semiconductor component instead of a plurality of semiconductor components. By virtue of the fact that the shaping carrier element introduces the luminescence conversion element into the beam path, this achieves a constancy of the wavelength range of the emitted mixed light over the emission location.

By means of the positioning of the luminescence conversion element in the carrier element, a targeted positioning is achieved and a maximum conversion of the primary radiation is made possible. Advantageously, the carrier element is shaped in such a way that the luminescence conversion element is distributed homogeneously. This produces a homogeneous luminescence conversion layer and achieves a constant optical path for the totality of the photons to be converted through the conversion element.

By means of the positioning of the luminescence conversion element in a shaped cavity in the carrier element, an exact positioning is possible. The advantage in this case is the simple process-technological realization of this arrangement. A connecting element can likewise be introduced into the cavity. By virtue of the shape of the cavity of the carrier element, the connecting element is likewise positioned and distributed homogeneously and a constant optical propagation path of the photons of the electromagnetic primary radiation through the connecting means is thus achieved. Thereafter, the photons will emit light of an electromagnetic secondary radiation.

By embodying the luminescence conversion element in the form of a phosphor, it is possible to insert the luminescence conversion element in conjunction with the resin mixture into the beam path of the semiconductor chip.

By embodying the carrier element as an optical element, it is possible to optically deflect the emitted mixed light wavelengths in order, for example, to produce a lens effect. A fluctuation of the wavelength range of the mixed light to be emitted over the emission location is thereby compensated for and a higher energy efficiency of the semiconductor component is furthermore achieved.

In an advantageous manner, the surface of the semiconductor chip and also the surface of the connecting element are produced in planar fashion. This results in an emission of the light parallel to the normal to the surface and prevents an electromagnetic primary radiation scattered light. In a further advantageous manner, the connecting element is configured such that it is transparent to the mixed light to be emitted. Energy efficiencies are thereby increased since now the connecting element does not absorb energy. The necessary holding force of the connecting element between carrier element and semiconductor chip is generated, for example, by adhesion or compressive and tensile forces.

BRIEF DESCRIPTION OF THE DRAWINGS

The invention is explained below on the basis of exemplary embodiments with reference to the drawings, wherein the figures of identical or identically acting constituent parts are in each case depicted with the same reference symbols. The elements illustrated should not be regarded as true to scale; rather, individual elements may be illustrated with an exaggerated size or in an exaggeratedly simplified manner in order to afford a better understanding. In the figures:

FIG. 1 shows a schematic illustration of a carrier element with a cavity for a luminescence conversion element and a connecting element, FIG. 2, which includes FIGS. 2a-2f, shows a schematic illustration of a first exemplary embodiment of an arrangement for generating mixed light, and FIG. 3, which includes 3a-3d, shows a schematic illustration of a second exemplary embodiment of an arrangement for generating mixed light.

DETAILED DESCRIPTION OF ILLUSTRATIVE EMBODIMENTS

FIG. 1 provides a schematic illustration of a carrier element 1 with a cavity 2 for a luminescence conversion element 3 and a connecting element 4 (see FIG. 2d).

The carrier element 1 is embodied here in the form of a hemisphere. A two-dimensional section through the midpoint of the hemisphere is shown in this illustration. At the base area of the hemisphere, which is at the same time also a contact area with respect to the semiconductor chip $5d$ (FIG. 2e), the surface is not embodied in planar fashion but rather characterized by an open cavity 2. This cavity is subdivided into three partial spaces $2a$, $2b$ and $2c$ situated on different planes parallel to the base area. In this case, the partial spaces $2b$ and $2c$ are situated on the same plane. The plane of the cavity $2a$ that is further away from the midpoint of the hemisphere serves for placing and positioning a luminescence conversion element 3. The cavity $2b$ serves for positioning and placing a connecting element 4, and the cavity $2c$ constitutes a spacer for the bonding wiring $5b$ (FIG. 2e).

FIG. 2 shows a schematic illustration of a first exemplary embodiment of an arrangement for generating a mixed light.

FIG. 2a once again presents the form of the carrier element 1 as presented in FIG. 1. By means of a metering unit 7a, a luminescence conversion element 3 in FIG. 2b is placed into the cavity provided therefor for the luminescence conversion element 3.

In FIG. 2c, a connecting element 4 is additionally added to the arrangement by means of a further metering unit 7b, wherein the connecting element 4 is introduced into the cavity 2b provided therefor. A connecting element in the form of an adhesive is used in this exemplary embodiment. The luminescence conversion element 3 here has already been positioned in the cavity 2a. FIG. 2d then illustrates the carrier element 1 with positioned and homogeneously arranged luminescence conversion element 3 and connecting element 4. In FIG. 2e, an LED carrier 5 comprising contact connections 5a, bonding wiring 5b, housing 5c and a semiconductor chip 5d is then combined with the construction from FIG. 2d in a combining step 6.

FIG. 2f shows the complete arrangement comprising carrier element 1, phosphor 3, semiconductor chip 5d and LED carrier 5. Connecting element 4, which is arranged between semiconductor chip 5d and luminescence conversion element 3 is not shown in FIG. 2f.

It should be noted that a connecting element serves to apply a holding force. In the embodiment in FIG. 2, the connecting means is provided as an adhesion-imparting element, such as an adhesive, for example, by means of which the holding force between LED carrier 5 and carrier element 1 is achieved ideally at an atomic level.

In the exemplary embodiment illustrated in FIG. 2, the cavity serves for the placement of the luminescence conversion element 3 and of the connecting element 4 and also for the homogeneous arrangement of both elements. The elements introduced in planar fashion can be discerned in accordance with FIG. 2. Ideally, the surface of the semiconductor chip 5d is likewise planar. By means of this measure, the primary radiation is preferably emitted parallel to the normal to the surface.

By means of an exact shape of the cavity, it is now possible to perform a placement, positioning and homogeneous arrangement of these elements 3 and 4 without requiring complex processes such as screen printing or sedimentation. By virtue of the homogeneous arrangement of the two substances, the emitted primary wavelength will cover the same optical distance through both elements 3 and 4 on each section of the beam path and thus at least partly convert the primary wavelength primarily situated in the primary radiation into a secondary wavelength situated in the converted secondary radiation.

If the carrier element 1 is additionally embodied as an optical element, such as, for example, as a diverging or converging lens, firstly an optical deflection of the mixed light is produced, and secondly a concentration and hence an intensity increase in the light intensity are obtained. By virtue of the given geometry, fluctuations of the wavelength range of the mixed light generated are minimal.

FIG. 3 shows a schematic illustration of a second exemplary embodiment of an arrangement for generating mixed light. An essential difference with respect to the previous figures is the shape of the carrier element 1. In this case, the cavity 2 is only provided for the luminescence conversion element 3 and the bonding wiring 5b. FIG. 3b is equivalent to FIG. 2c. In FIG. 3c, the carrier element 1 equipped with luminescence conversion element 3 is combined in step 6 with the LED carrier 5. FIG. 3d illustrates the complete arrangement with carrier element 1, LED carrier 5, luminescence conversion element 3 and semiconductor chip 5d.

In this exemplary embodiment, the geometries of semiconductor chip 5d and carrier element 1 are chosen in such a way that a press fit arises during the combining process 6. This combination generates a holding force that arises solely as a result of friction between the areas of semiconductor chip 5d and carrier element 1 that make contact. The mechanical holding force can additionally be applied or increased by the provision of undercuts, specific geometrical shaped portions, latchings, additional mechanical holding elements, etc., which are not illustrated in greater detail.

The invention described relates to an arrangement and a method for producing such an arrangement which serves for generating mixed light. In this case, a semiconductor chip that emits an electromagnetic primary radiation has a luminescence conversion element in the beam path of the primary radiation. Furthermore, the arrangement comprises a connecting element and a carrier element, wherein the carrier element carries and shapes the luminescence conversion element and the connecting element.

The invention claimed is:

1. An arrangement for generating mixed light, the arrangement comprising:
   at least one semiconductor chip that emits an electromagnetic primary radiation;
   a luminescence conversion element in a beam path of the electromagnetic primary radiation of the at least one semiconductor chip;
   a connecting element between the at least one semiconductor chip and the luminescence conversion element; and
   a carrier element that shapes the luminescence conversion element,
   wherein the luminescence conversion element is introduced into the beam path by means of the carrier element;
   wherein the carrier element includes a cavity to set position of the luminescence conversion element, the cavity including first, second and third sub-cavities; and
   wherein the luminescence conversion element is arranged in the first sub-cavity, the connecting element is arranged in the second sub-cavity and bond wires of the at least one semiconductor chip are arranged in the third sub-cavity.

2. The arrangement as claimed in claim 1, wherein the luminescence conversion element comprises a phosphor.

3. The arrangement as claimed in claim 1, wherein the carrier element comprises an optical element.

4. The arrangement as claimed in claim 1, wherein the luminescence conversion element converts the electromagnetic primary radiation at least partly into an electromagnetic secondary radiation.

5. The arrangement as claimed in claim 4, further comprising an LED carrier, wherein the semiconductor chip is connected to the LED carrier and the luminescence conversion element is positioned relative to the at least one semiconductor chip by means of the carrier element.

6. The arrangement as claimed in claim 5, wherein the luminescence conversion element is shaped by the carrier element in such a way that the luminescence conversion element is arranged homogeneously.

7. The arrangement as claimed in claim 6, wherein the at least one semiconductor chip has a planar surface.

8. The arrangement as claimed in claim 7, wherein the connecting element has a planar surface.

9. The arrangement as claimed in claim 8, wherein the connecting element is transparent to mixed light to be emitted.

10. The arrangement as claimed in claim 9, wherein the connecting element generates a holding force between the carrier element and the LED carrier by adhesion.

11. The arrangement as claimed in claim 9, wherein the connecting element generates a holding force between the carrier element and the LED carrier by mechanical means.

12. A method for producing an arrangement for generating mixed light, the method comprising:
providing at least one semiconductor chip that emits an electromagnetic primary radiation; and
positioning a luminescence conversion element in a beam path of the electromagnetic primary radiation by means of a carrier element, the at least one semiconductor chip being connected to the luminescence conversion element by a connecting element, wherein the positioning is effected by a cavity in the carrier element and wherein the luminescence conversion element is arranged in a first sub-cavity of the cavity, the connecting element is arranged in a second sub-cavity of the cavity, and bond wires of the at least one semiconductor chip are arranged in a third sub-cavity of the cavity.

13. The method as claimed in claim 12, wherein the luminescence conversion element is arranged homogeneously by means of the cavity.

14. The method as claimed in claim 13, wherein providing the semiconductor chip comprises providing at least one semiconductor chip connected to an LED carrier and wherein a holding force between the carrier element and the LED carrier is generated by the connecting element mechanically.

15. The method as claimed in claim 12, wherein providing the semiconductor chip comprises providing at least one semiconductor chip connected to an LED carrier and wherein a holding force between the carrier element and the LED carrier is generated by the connecting element adhesively.

16. The method as claimed in claim 15, wherein the connecting element is positioned and arranged homogeneously in the cavity in the carrier element.

17. The method as claimed in claim 13, further comprising generating mixed light and transmitting the mixed light through the connecting element and the carrier element.

18. The method as claimed in claim 17, wherein the at least one semiconductor chip, the connecting element and the carrier element each have a planar surface.

19. The method as claimed in claim 18, wherein the carrier element optically deflects the mixed light generated.

20. A method for producing an arrangement for generating mixed light, the method comprising:
providing a carrier element having a cavity that is subdivided into a plurality of sub-cavities, adjacent ones of the sub-cavities situated on different planes parallel to a base area of the cavity;
forming a luminescence conversion element in one of the sub-cavities; and
forming a connecting material in a second one of the sub-cavities; and
locating at least one semiconductor chip in the cavity of the carrier element, wherein the at least one semiconductor chip emits electromagnetic energy and the luminescence conversion element is located in a beam path of the electromagnetic radiation, wherein the connecting material adheres the at least one semiconductor chip to the luminescence conversion element and wherein a third one of the sub-cavities is situated to receive bond wires of the at least one semiconductor chip.

21. The method as claimed in claim 20, wherein forming the luminescence conversion element comprises dispensing a conversion material from a metering unit and wherein forming the connecting material comprises dispensing the connecting material from a metering unit.

22. The method as claimed in claim 20, wherein a center point of the one of the sub-cavities is spaced from a midpoint of the carrier element.

* * * * *

UNITED STATES PATENT AND TRADEMARK OFFICE
CERTIFICATE OF CORRECTION

PATENT NO. : 8,368,101 B2
APPLICATION NO. : 12/523487
DATED : February 5, 2013
INVENTOR(S) : Braune et al.

Page 1 of 1

It is certified that error appears in the above-identified patent and that said Letters Patent is hereby corrected as shown below:

In the Claims

In Col. 7, line 30, claim 15, delete "claim 12" and insert --claim 13--.
In Col. 8, line 16, claim 20, delete "and".

Signed and Sealed this
Fourth Day of June, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,368,101 B2  Page 1 of 1
APPLICATION NO. : 12/523487
DATED : February 5, 2013
INVENTOR(S) : Braune et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 513 days.

Signed and Sealed this
First Day of September, 2015

Michelle K. Lee
*Director of the United States Patent and Trademark Office*